United States Patent [19]

Shioda

[11] Patent Number: 5,105,102
[45] Date of Patent: Apr. 14, 1992

[54] OUTPUT BUFFER CIRCUIT
[75] Inventor: Fumio Shioda, Tokyo, Japan
[73] Assignee: NEC Corporation, Tokyo, Japan
[21] Appl. No.: 662,524
[22] Filed: Feb. 28, 1991
[30] Foreign Application Priority Data
　Feb. 28, 1990 [JP] Japan .................................. 2-45918
[51] Int. Cl.⁵ ............................................. H03K 17/16
[52] U.S. Cl. .................................... 307/443; 307/475
[58] Field of Search ............... 307/443, 451, 475, 572, 307/585

[56] References Cited
U.S. PATENT DOCUMENTS
5,043,604  8/1991  Komaki ............................ 307/443 X
5,043,607  8/1991  Danckaert et al. ................... 307/475

Primary Examiner—David Mis
Attorney, Agent, or Firm—Sughrue, Mion, Zinn, Macpeak & Seas

[57] ABSTRACT

An output buffer circuit which supplies at an emitter coupled logic (ECL) level logic signals from a logic circuit in an integrated circuit realized by a CMOS process. The logic signals are supplied to the gate electrodes of a first P-channel CMOS transistor and a first N-channel CMOS transistor connected in series. A second P-channel CMOS transistor for amplifying the output signal has an open drain configuration. Between the output terminal of the output from the P-channel CMOS transistor of open drain configuration and an external power supply terminal is connected a first resistor. Voltage regulating means, connected between the output terminal and the external power supply terminal, regulates the output voltage at the output terminal. In the voltage regulating means, a voltage setting circuit produces a desired voltage from a voltage supplied from the external power supply terminal. A control voltage generating circuit so generates a control voltage as to have the voltage at the output terminal regulated by the desired voltage on the basis of the voltage produced by the voltage setting circuit. A regulating driver circuit regulates the voltage at the output terminal to a prescribed voltage with the control voltage.

14 Claims, 3 Drawing Sheets

5,105,102

OUTPUT BUFFER CIRCUIT

BACKGROUND OF THE INVENTION

The present invention relates to an output buffer circuit for driving the external signal lines of integrated circuits, and more particularly to an ECL (emitter coupled logic) level output buffer circuit having a level converting function which converts the signal level in integrated circuits into an ECL level.

DESCRIPTION OF THE PRIOR ART

This kind of output buffer circuit is used in converting the signal level in an integrated circuit into a prescribed ECL level and supplying the converted signals outside.

In a conventional output buffer circuit, the output section has an open drain transistor. Therefore, without pulling-up the output terminal by a resistance element, one of the signal levels takes on a high impedance to make it impossible to obtain an output voltage. Therefore, in the conventional ECL level output buffer circuit realized by a CMOS process, an external resistor of, for instance, 50 ohms is connected between the output terminal and the power source terminal of about $-1.7$ volts to ensure the low level output voltage. As a result, a power source of about $-1.7$ volts is required.

Meanwhile, in a usual ECL integrated circuit realized by a bipolar process, where an open type output buffer circuit is used, the low level output voltage is ensured by similar means. However, a power source, connected to an external resistor, whose voltage is about $-2.0$ volts is required because of the characteristics of the ECL circuit.

Therefore, where CMOS integrated circuits having built-in ECL level output buffer circuits realized by a CMOS process and ECL integrated circuits realized by a bipolar process are to be used in combination, two different power sources, one of $-2.0$ volts and the other of $-1.7$ volts, are required to ensure the low level voltage of the output buffer circuits.

SUMMARY OF THE INVENTION

An object of the present invention, therefore, is to provide integrated circuits having output buffer circuits which can be driven by fewer power sources even where integrated circuits with built-in ECL level output buffer circuits realized by a CMOS process and integrated circuits realized by a bipolar process are to be used in combination.

Another object of the invention is to provide output buffer circuits which can be driven by a smaller number of power sources.

An output buffer circuit according to the present invention comprises:

output means provided with first amplifying means having a serially connected first P-channel CMOS transistor to whose gate electrode are supplied logic signals and a first N-channel CMOS transistor; second amplifying means, having a second P-channel CMOS transistor of open drain configuration, for amplifying the output signal of the first amplifying means; and a first resistor connected between the output terminal of said second amplifying means and an external power supply terminal; and voltage adjusting means, connected to the output terminal and the external power supply terminal, for adjusting the output voltage of said output terminal.

The voltage adjusting means preferably comprises:

a voltage setting circuit for producing a desired voltage from the voltage supplied to said external power supply terminal, a control voltage generating circuit for so generating a control voltage that the voltage of the output voltage be regulated by a prescribed voltage on the basis of the voltage produced by the voltage setting circuit, and a regulating driver circuit for regulating the voltage of the output terminal to the prescribed voltage with the control voltage.

BRIEF DESCRIPTION OF THE DRAWINGS

The above mentioned and other objects, features and advantages of this invention will become more apparent from the following detailed description when taken in conjunction with the accompanying drawings, wherein.

DETAILED DESCRIPTION OF THE PREFERRED EMBODIMENTS

Figure 1:
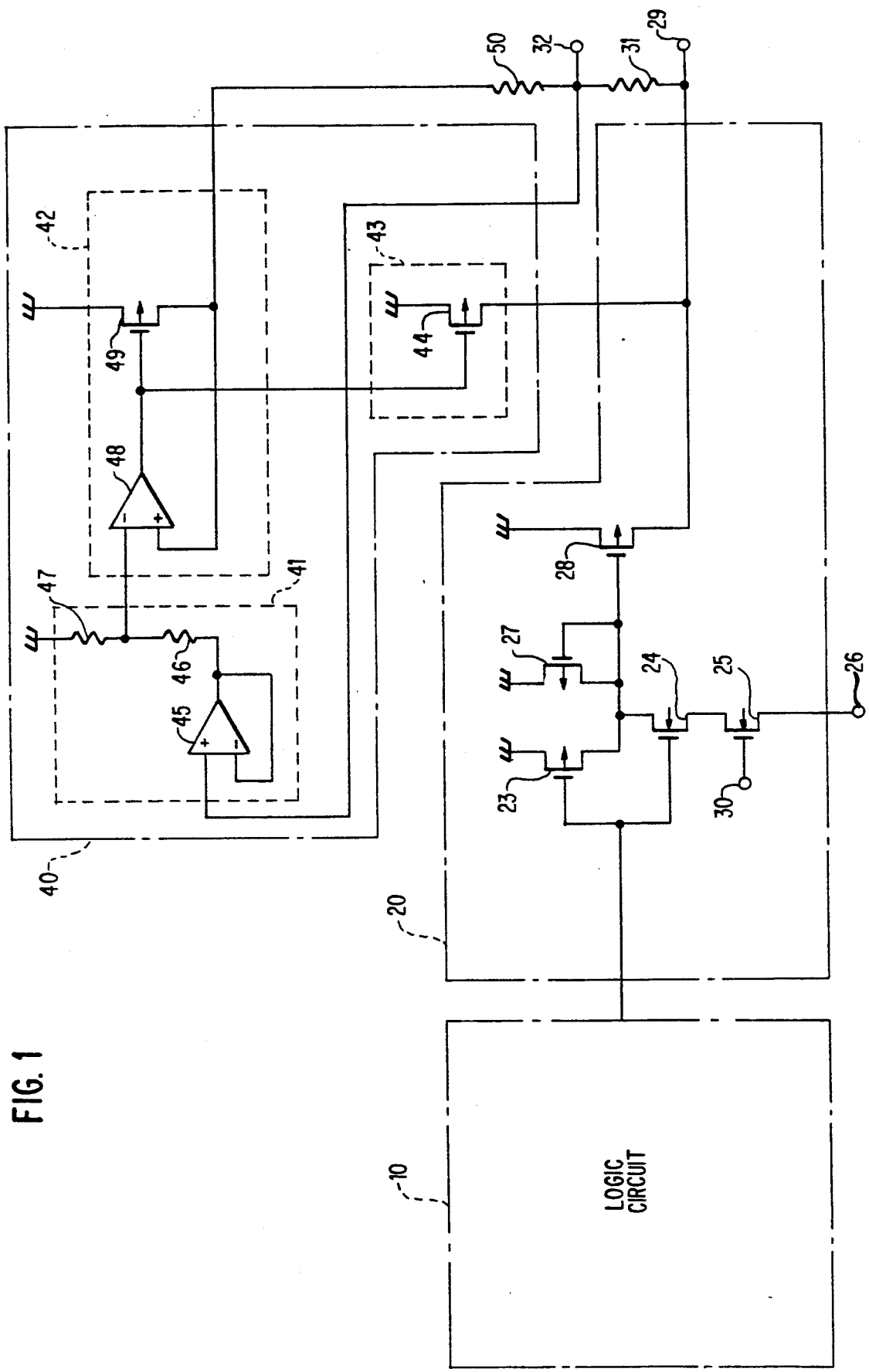
FIG. 1 is a block diagram of an integrated circuit which is a first preferred embodiment of the invention.

Referring to FIG. 1, an integrated circuit which is a first preferred embodiment of the present invention has a logic circuit 10 and an output buffer circuit 20 for supplying signals from the logic circuit 10. The logic circuit 10 supplies from its output terminal logic signals of "1" (high level) or "0" (low level) in logical value. The voltages represent the logical values "1" and "0" are 0 V and $-5.2$ V, respectively. Details of the logic circuit 10 are dispensed with here as it is a usual logic circuit.

In the output buffer circuit 20, a logic signal from the logic circuit 10 is supplied to the gate electrodes of a P-channel CMOS transistor 23 and an N-channel CMOS transistor 24, connected in series by connecting their respective drain electrodes. The source electrode of the transistor 24 is connected to the drain electrode of an N-channel CMOS transistor 25. The source electrode of the transistor 25 is connected to a first power supply terminal 26 of $-5.2$ V. The drain electrodes of the transistors 23 and 24 are connected to the drain and gate electrodes of a P-channel CMOS transistor 27 and the gate electrode of a P-channel CMOS transistor 28. The drain electrode of the transistor 28 is connected to an output terminal 29. The gate electrode of the transistor 25 is connected to a bias terminal 30.

The output section of this output buffer circuit 20 has an open drain configuration consisting of the transistor 28. In an open drain arrangement, without pulling-up by a resistance element, one of the levels takes on a high impedance to make it impossible to obtain an output. For this reason, an external resistor 31 of about 50 ohms is provided between the output terminal 29 and a second power supply terminal 32.

When a logic signal of "0" in logical value ($-5.2$ V in voltage) is supplied to this output buffer circuit 20 from the logic circuit 10, the gate voltages of the transistor 23 and 24 become −5.2 V, the transistor 23 is turned on, and the transistor 24 is turned off.

The transistor 25 is provided to regulate the current flowing through the transistors 24 and 27, and to its gate electrode is supplied a bias voltage of about −4 V from the bias terminal 30. As a result the transistor 25 operates as a current source. As the transistor 23 is turned on and the transistor 24 is turned off, the voltages of the drain and source electrodes of the transistor 27 become the ground voltage (0 V). As the drain electrode of the transistor 23 is connected to the gate electrode of the transistor 28, and the output voltage of the transistor 23 is the ground voltage, the transistor 28 is turned off. As a result, the output voltage of the output terminal 29 becomes the voltage of the second power supply terminal 32. In order to make the output voltage of the output terminal 29 −1.7 V, which is the low ECL level voltage, a source voltage of −1.7 V would be supplied to the second power supply terminal 32 in an integrated circuit according to the prior art. Thus, in the prior art circuit, the low level output voltage would be ensured by supplying a source voltage of −1.7 V to the second power supply terminal 32.

Meanwhile, when the logical value of the logic signal supplied from the logic circuit 10 to the output buffer circuit 20 changes to "1", i.e. when the input voltage becomes 0 V, the gate voltages of the transistors 23 and 24 also become 0 V, so that the transistor 23 is turned off and the transistor 24 is turned on. As the transistor 25 is operating as the current source and the transistor 24 is turned on, the drain electrode of the transistor 24 drops in voltage, the transistor 27 is turned on. As a result, the transistor 28 is turned on, and the output voltage of the output terminal 29 becomes about −0.9 V. This voltage is a result from the voltage division of the ground potential 0 V and the constant voltage (−1.7 V) supplied to the second power supply terminal 32 by the internal resistance of the transistor 28 and the external resistor 31.

Thus, in the output buffer circuit 20, the low level output voltage would be ensured by supplying a constant voltage of −1.7 V to the second power supply terminal 32. Thus in the ECL level output circuit realized by a CMOS process, ensuring the low level output voltage would require a power supply of −1.7 V.

Meanwhile, in the ECL integrated circuit realized by a bipolar process as well, an open type output buffer circuit is used. Accordingly, like in the ECL level output buffer circuit by the CMOS process, the output terminal is pulled up by a resistor connected to an external power source. In an ECL integrated circuit in which some current always flows, however, no high impedance emerges even when the transistor is off. Therefore, an external power source of about −2.0 V is used so that the voltage division output from the pull-up resistor and the off-resistance of the output stage transistor in the output buffer circuit be −1.7 V, which is the ECL low level. Accordingly, where a CMOS integrated circuit with a built-in ECL level output buffer circuit realized by a CMOS process and an ECL integrated circuit realized by a bipolar process are to be used in combination, two different power sources, one of −2.0 V and the other of −1.7 V, are needed to ensure the low level voltage of the output buffer circuit, and altogether three power sources are required including another of −5.2 V.

In the integrated circuit realized by a CMOS process, which is the first preferred embodiment of the invention shown in FIG. 1, there is provided a voltage regulating circuit 40. This voltage regulating circuit 40 so regulates the voltage at the output terminal 29 that a prescribed low level (−1.7 V) output voltage can be provided even if a constant voltage of −2.0 V is supplied to the second power supply terminal 32. This makes it feasible to make the voltage supplied to the second power supply terminal −2.0 V. Accordingly, the power source of −1.7 V, which would be needed according to the prior art, can be dispensed with, and even where this circuit is used in combination with an ECL integrated circuit realized by a bipolar process, the −2.0 V power source can commonly be used to ensure the low level output voltage of the output buffer circuit.

The voltage regulating circuit 40 consists of a voltage setting circuit 41 for producing a desired voltage from a voltage supplied to the second power supply terminal 32; a control voltage generating circuit 42 for so generating a control voltage that the voltage of the output terminal 29 be regulated to the prescribed −1.7 V on the basis of the voltage produced by said voltage setting circuit 41; and a regulating driver circuit 43 for regulating the voltage of the output terminal 29 to the prescribed −1.7 V with the control voltage from the control voltage generating circuit 42.

The regulating driver circuit 43 consists of a P-channel MOS transistor 44 of which the drain electrode is connected to the output terminal 29 and the source electrode is grounded. The gate electrode of the transistor 44 receives the control voltage from the control voltage generating circuit 42.

The voltage setting circuit 41 consists of a differential amplifier 45 and first and second resistors 46 and 47.

In the voltage setting circuit 41, the positive input terminal of the differential amplifier 45 is connected to the second power supply terminal 32. The output terminal of the differential amplifier 45 is connected to the negative input terminal, and is also grounded via the resistors 46 and 47 connected in series. The voltage setting circuit 41 produces the desired voltage of −1.7 V by the voltage dividing ratio between the resistors 46 and 47 (which is 3:17 in the first preferred embodiment), and its set voltage is supplied from the connecting point of the resistors 46 and 47. In the voltage setting circuit 41, the differential amplifier 45 is provided to protect the −2.0 V power source (not shown) connected to the second power supply terminal 32, and its amplification ratio is 1.

The control voltage generating circuit 42 consists of a differential amplifier 48, a P-channel transistor 49.

In the control voltage generating circuit 42, the negative input terminal of the differential amplifier 48 is connected to the connecting point of the resistors 46 and 47 in the voltage setting circuit 41, and its output terminal is connected to the gate electrode of the P-channel CMOS transistor 49. The drain electrode of the transistor 49 is connected to the positive input terminal of the differential amplifier 48, and further to the second power supply terminal 32 via an external resistor 50 having the same resistance as the external resistor 31. The output terminal of the differential amplifier 48 is also connected to the gate electrode of the transistor 44. The differential amplifier 48 supplies its output signal to the transistor 44 as the control voltage. A transistor substantially the same as the transistor 44 in size is used as the transistor 49.

The voltage of −2.0 V supplied to the second power supply terminal 32 is supplied to the output terminal 29 via the external resistor 31, directly to the positive input terminal of the differential amplifier 45 of the voltage setting circuit 41, and further to the positive input terminal of the differential amplifier 48 of the control voltage generating circuit 42 via the external resistor 50.

Since the amplification ratio of the differential amplifier 45 is 1 as stated above, a voltage of −2.0 V is supplied to the serial circuit consisting of the resistors 46 and 47. As the resistance ratio between the resistors 46 and 47 is set to be 3:17, the voltage at the connecting point of the resistors 46 and 47 is −1.7 V. This voltage of −1.7 V is supplied to the negative input terminal of the differential amplifier 48.

In the control voltage generating circuit 42, as feedback is effected via the transistor 49 which is always turned on, the positive input terminal of the differential amplifier 48 is maintained at −1.7 V. Since the transistors 49 and 44 have the same size and the external resistors 50 and 31 are equal in resistance, an output voltage of the drain electrode of the transistor 44 is also kept at −1.7 V.

If the logic circuit 10 supplies a logical value of "0", the low ECL level is output from the output terminal 29. In this case, the transistor 28 is completely turned off since the gate voltage of the transistor 28 is at the ground potential (0 V). Meanwhile, the same control voltage as the gate voltage of the transistor 49 is supplied to the gate electrode of the transistor 44. Thus the voltage at the output terminal 29 reaches the same level as that at the drain electrode of the transistor 49 (the voltage at the positive input terminal of the differential amplifier 48) and ensured at −1.7 V. The operation in response to a logical value of "1" (0 V) is the same as in the prior art.

Figure 2:
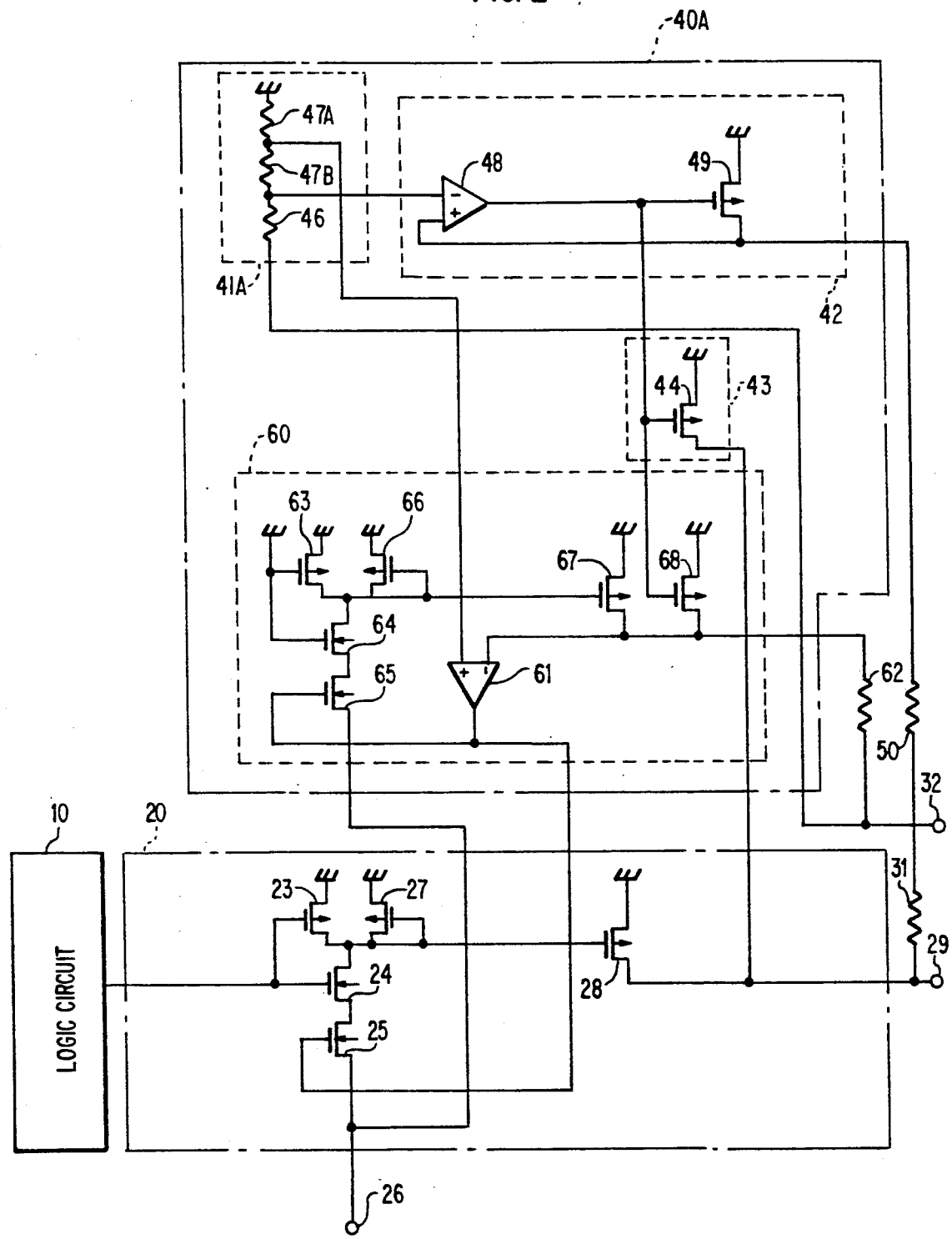
FIG. 2 is a block diagram of an integrated circuit which is a second preferred embodiment of the invention.

Referring now to FIG. 2, an integrated circuit which is a second preferred embodiment of the present invention differs in the following respects from the first embodiment illustrated in FIG. 1.

(1) In a voltage regulating circuit 40A, a serial circuit consisting of a voltage setting circuit 41A comprising resistors 47A, 47B and 46 is provided instead of the voltage setting circuit 41. In this embodiment, the resistance ratio among the resistors 47A, 47B and 46 is 9:8:3. Because of the voltage of −2.0 V supplied to the terminal 32, the voltage at the connecting point between the resistors 46 and 47B is −1.7 V, and that at the connecting point between the resistors 47B and 47A is −0.9 V.

(2) As the source of bias supplied to the gate electrode of the transistor 25, there is provided a bias generating circuit 60. In the bias generating circuit 60, the voltage of −0.9 V from the connecting point between the resistors 47A and 47B of the voltage setting circuit 41A is supplied to the positive input terminal of a differential amplifier 61. To the negative input terminal of the differential amplifier 61 is supplied power from the second power supply terminal 32 via an external resistor 62. To the negative input terminal of the differential amplifier 61 is further provided negative feedback from its own output via a circuit which consist of transistors 63 to 67. The transistors 63, 64, 65, 66, 67 and 68 have the same size as the transistors 23, 24, 25, 27, 28 and 44, respectively. Further in the bias generating circuit 60, the transistors 64 to 67 are always turned on while the transistor 63 is turned off.

When the logic signal from the logic circuit 10 is "0" in logical value (−5.2 V), the low level output voltage at the output terminal 29 is ensured at −1.7 V as in the first preferred embodiment. When it is "1" in logical value (0 V), the voltages of the gate electrodes of the transistors 23 and 24 will become the ground potential, and a certain voltage is applied to the gate electrode of the transistor 28. This voltage is equal to the voltages at the output terminal 29 and the drain electrode of the transistor 68, i.e. −0.9 V, because the transistors 63, 64, 65, 66, 67 and 68 have the same size as the transistors 23, 24, 25, 27, 28 and 44, respectively, and the external resistor 62 is so set as to have the same resistance as the external resistor 31. Therefore, the result that the high ECL level output voltage of the output buffer circuit can be ensured at −0.9 V.

Figure 3:
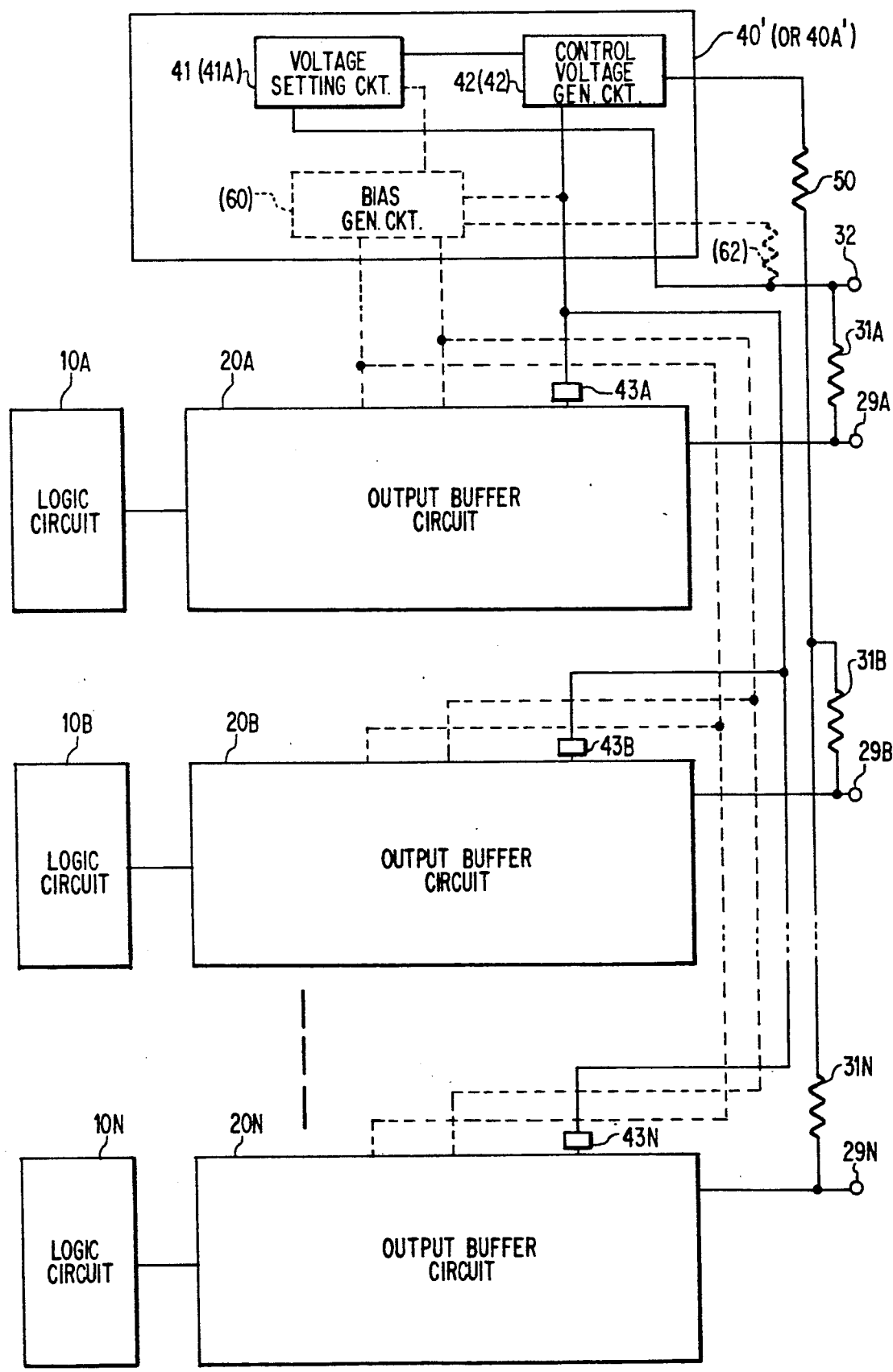
FIG. 3 is a block diagram of an integrated circuit which is a third preferred embodiment, and a fourth preferred embodiment, of the invention.

FIG. 3 is a block diagram of a third, and also a fourth, preferred embodiments of the present invention. The third and fourth embodiments illustrate the configuration where a plurality of output buffer circuits are to be used. Referring to FIG. 3, output buffer circuits 20A to 20N are connected to logic circuits 10A to 10N, respectively. Further, a voltage regulating circuit 40' is connected in common to the output buffer circuits 20A to 20N. The voltage regulating circuit 40' has the same configuration as the voltage regulating circuit 40 in FIG. 1 except that the regulating driver circuit 43 is absent. Meanwhile, the output buffer circuits 20A to 20N are separately provided with regulating driver circuits 43A to 43N, respectively. This is because if a single regulating driver circuit 43, i.e. the transistor 44, is connected to all the output buffer circuits 20A to 20N, the voltage relationship between the drains of two transistors 44 and 49 changes not to ensure the ECL low level of the output buffer circuits 20A to 20N. For this reason, in the embodiments of FIG. 3, what is supplied by the voltage regulating circuit 40' is the output voltage of the differential amplifier 48, and it is supplied to the gage terminals of P-channel transistors 44A to 44N (not shown) constituting the resulating driver circuits 43A to 43N, respectively. This configuration makes it possible for the single voltage regulating circuit 40' to ensure the low ECL level outputs of the plurality of output buffer circuits 20A to 20N.

Further, by using a voltage regulating circuit 40A' having the same configuration as the voltage regulating circuit 40A in FIG. 2 except that the regulating driver circuit 43 is absent, high and low ECL level outputs can be ensured for a plurality of output buffer circuits 20A to 20N. This configuration is shown in FIG. 3 in dotted lines.

As hitherto described, the present invention provides the benefits of making it possible for the output buffer circuit of an ECL integrated circuit by a bipolar process and an ECL level output buffer circuit by a CMOS process to use a common external power source for ensuring the low ECL output level by adding to the ECL level output buffer circuit by the CMOS process a voltage regulating circuit for regulating the voltage of power from an external source, and further to ensure the high ECL level output as well.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments that may fall within the true scope of the invention.

What is claimed is:

1. An output buffer circuit comprising:
   output means provided with first amplifying means having a serially connected first P-channel CMOS transistor to whose gate electrode are supplied logic signals and a first N-channel CMOS transistor; second amplifying means, having a second P-channel CMOS transistor of open drain configuration, for amplifying the output signal of said first amplifying means; and a first resistor connected between the output terminal of said second amplifying means and an external power supply terminal; and
   voltage adjusting means, connected to said output terminal and said external power supply terminal, for adjusting the output voltage of said output terminal.

2. An output buffer circuit, as claimed in claim 1, wherein said voltage adjusting means comprises:
   a voltage setting circuit for producing a desired voltage from the voltage supplied to said external power supply terminal,
   a control voltage generating circuit for so generating a control voltage that the voltage of said output voltage be regulated by a prescribed voltage on the basis of the voltage produced by said voltage setting circuit, and
   a regulating driver circuit for regulating the voltage of said output terminal to the prescribed voltage with said control voltage.

3. An output buffer circuit, as claimed in claim 2, wherein said voltage setting circuit has a plurality of serially connected resistors connected between said external power supply terminal and a ground potential, and obtains said desired voltage from the connecting point of said serially connected resistors.

4. An output buffer circuit, as claimed in claim 2, wherein said voltage setting circuit has:
   a differential amplified whose positive input terminal is connected to said external power supply terminal and whose negative input terminal is supplied with a feedback signal from the output end, and
   a plurality of serially connected resistors connected between the output end of said differential amplifier and a ground potential, and
   obtains said desired voltage from the connecting point of said serially connected resistors.

5. An output buffer circuit, as claimed in claim 2, wherein said control voltage generating circuit has:
   a differential amplifier whose input terminal is supplied with said desired voltage from said voltage setting circuit,
   a third P-channel CMOS transistor whose gate electrode is supplied with the output signal of said differential amplifier and whose drain electrode is connected to the positive input terminal of said differential amplifier, wherein:
   the output signal of said differential amplifier is supplied to said regulating driver circuit.

6. An output buffer circuit, as claimed in claim 5, wherein said first and second resistors have the same resistance values.

7. An output buffer circuit, as claimed in claim 2, wherein said regulating driver circuit has a third P-channel CMOS transistor whose gate electrode is supplied with said control voltage and whose drain electrode is connected to said output terminal.

8. An output buffer circuit, as claimed in claim 2, wherein:
   said voltage setting circuit has a plurality of serially connected resistors connected between said external power supply terminal and the ground potential, and obtains said desired voltage from the connecting point of said serially connected resistors;
   said control voltage generating circuit has a differential amplifier whose negative input terminal is supplied with said desired voltage from said voltage setting circuit, and a third P-channel CMOS transistor whose gate electrode is supplied with the output signal of said differential amplifier and whose drain electrode is connected to the positive input terminal of said differential amplifier, wherein the output signal of said differential amplifier is supplied to said regulating driver circuit; and
   said regulating driver circuit has a fourth P-channel CMOS transistor whose gate electrode is supplied with said control voltage and whose drain electrode is connected to said output terminal.

9. An output buffer circuit, as claimed in claim 2, wherein:
   said voltage setting circuit has a differential amplifier whose positive input terminal is connected to said external power supply terminal and whose negative input terminal is supplied with a feedback signal from the output end and a plurality of serially connected resistors connected between the output of said differential amplifier and the ground potential, and obtains said desired voltage from the connecting point of said serially connected resistors;
   said control voltage generating circuit has a differential amplifier whose negative input terminal is supplied with said desired voltage from said voltage setting circuit, and a third P-channel CMOS transistor whose gate electrode is supplied with the output signal of said differential amplifier and whose drain electrode is connected to the positive input terminal of said differential amplifier, wherein the output signal of said differential amplifier is supplied to said regulating driver circuit; and
   said regulating driver circuit has a fourth P-channel CMOS transistor whose gate electrode is supplied with said control voltage and whose drain electrode is connected to said output terminal.

10. An output buffer circuit, as claimed in claim 9, wherein said third and fourth P-channel CMOS transistors have the same performance characteristics.

11. An output buffer circuit, as claimed in claim 2, wherein:
    said output means has a second N-channel CMOS transistor whose gate electrode is supplied with a bias voltage, and
    said voltage regulating circuit has bias voltage generating means for generating said bias voltage on the basis of the voltage supplied from said external power supply terminal.

12. An output buffer circuit, as claimed in claim 11, wherein:
    said voltage setting circuit generates a second desired voltage different from said desired voltage, and
    said bias voltage generating means has a serial circuit including said fifth P-channel CMOS transistor and third N-channel CMOS transistor connected in series, a sixth P-channel CMOS transistor connected to said serial circuit, and a differential amplifier whose positive input terminal is supplied with said second desired voltage and to whose negative input terminal is connected the drain electrode of said sixth P-channel CMOS transistor, wherein the output of said differential amplifier is supplied to said output means as said bias voltage.

13. An output buffer circuit, as claimed in claim 12, wherein said serial circuit has a third N-channel CMOS transistor whose gate electrode receives said bias voltage.

14. An output buffer circuit, as claimed in claim 1, wherein a plurality of said output buffer circuits are provided and the output voltage of said output terminal of each of said plural output buffer circuit is regulated by said voltage regulating circuit.

* * * * *